United States Patent

Ishikawa et al.

[11] Patent Number: 6,088,234
[45] Date of Patent: Jul. 11, 2000

[54] CONNECTION STRUCTURE OF CIRCUIT PROTECTION ELEMENT

[75] Inventors: Satoshi Ishikawa; Osamu Soda, both of Shizuoka, Japan

[73] Assignee: Yazaki Corporation, Tokyo, Japan

[21] Appl. No.: 09/323,693

[22] Filed: Jun. 2, 1999

[30] Foreign Application Priority Data

May 6, 1998 [JP] Japan ................................. 10-157614

[51] Int. Cl.[7] ................................................. H05K 07/02
[52] U.S. Cl. .......................... 361/760; 361/765; 361/779; 337/402; 337/403; 337/405; 174/260; 174/261; 174/262
[58] Field of Search ..................................... 361/760, 765, 361/774, 795, 779; 337/405, 402, 403, 404; 174/261, 262, 260; 228/180.1, 180.21; 29/840, 837

[56] References Cited

U.S. PATENT DOCUMENTS

| 3,710,196 | 1/1973 | Fifield ..................................... 361/779 |
| 3,868,770 | 3/1975 | Davis et al. ............................... 29/837 |
| 4,761,881 | 8/1988 | Bora et al. ................................. 29/840 |
| 5,280,262 | 1/1994 | Fischer .................................... 337/405 |
| 5,484,963 | 1/1996 | Washino ................................... 174/261 |
| 5,600,295 | 2/1997 | Kaufmann ................................. 337/405 |
| 5,668,702 | 9/1997 | Nassimi ................................... 361/820 |

*Primary Examiner*—Leo P. Picard
*Assistant Examiner*—David Foster
*Attorney, Agent, or Firm*—Armstrong, Westerman Hattori, McLeland & Naughton

[57] ABSTRACT

The connection structure of a circuit protection element for securely connecting at least two lead terminals of the circuit protection element to a circuit board includes terminal connection elongated holes each provided in the circuit board for connecting the lead terminals to the circuit board by soldering. The circuit board is positioned in such a way that the elongated direction of the elongated terminal connection hole is positioned in a downward direction. When an abnormal current is applied to the circuit, or when the circuit protection element fails to heat itself up to a high temperature, the solder melts. Thereby, the lead terminals easily disengage from the terminal connection holes so that the circuit protection element falls freely from the circuit board. Thus, the circuit is surely cut off easily.

4 Claims, 3 Drawing Sheets

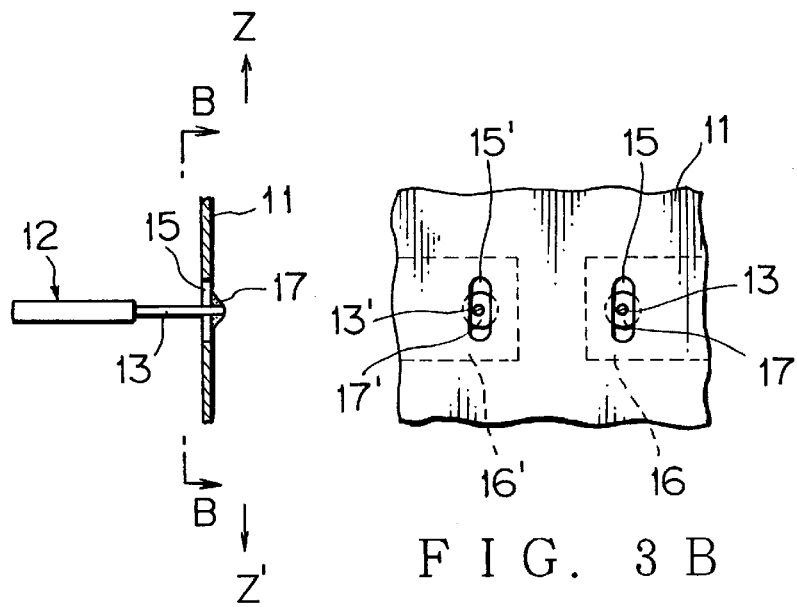
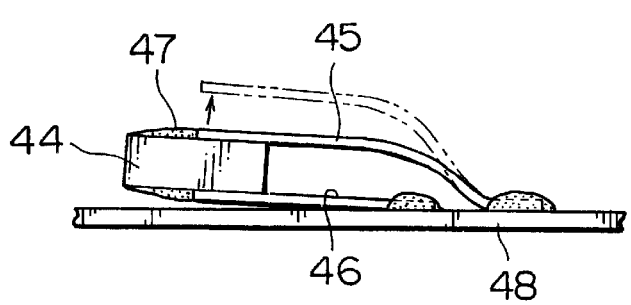
PRIOR ART
FIG. 7
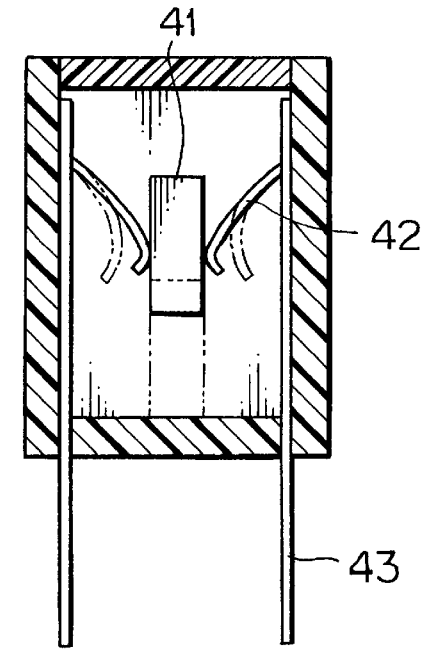
PRIOR ART
FIG. 6

CONNECTION STRUCTURE OF CIRCUIT PROTECTION ELEMENT

BACKGROUND OF THE INVENTION

1. Field of the Invention

The present invention relates to a connection structure of a circuit protection element, which can overcome an abnormal heat generation in a circuit protection element such as a positive characteristic thermister and its connection portion for cutting off overcurrent of an associated electronic circuit board.

2. Prior Art

In an electronic circuit board, a positive characteristic thermister (called PTC hereinafter) is widely used as a circuit protection element for cutting off overcurrent. The PTC has the character that its resistance increases in a quadratic curve with its temperature increase. The PTC generates heat to increase its resistance when provided with an overcurrent, which reduces or cuts off the current to protect the circuit.

Some conventional connection structures of a circuit protection element will be discussed hereafter.

FIG. 6 shows a first connection structure disclosed in Japanese Patent Application Laid-open No. H. 6-151107.

This structure is characterized in that PTC 41 contacts a spring piece 42 having a shape memory property. The spring piece 42 is connected to an electric power supply terminal 43. When the spring piece 42 is heated to more than a predetermined temperature, the spring piece 42 opens outwardly as shown by phantom lines to part from PTC 41, cutting off the power supply.

FIG. 7 shows a second connection structure disclosed in Japanese Patent Application Laid-open No. H. 8-250304.

The second structure characteristically has a pair of lead terminals 45, 46 connected to PTC 44 by solder 47, and one lead terminal 45 has an outward resilience to be spaced from the other 46. The lead terminals 45, 46 are connected to a circuit board 48. When PTC 44 generates an abnormal heat to melt the solder 47, the lead terminal 45 springs back to part from PTC 44, resulted in cutting-off of current.

Japanese Patent Application Laid-open No. H. 9-73848 discloses a connection structure having a coil spring (not shown) provided in line with the lead terminal 45 described of FIG. 7. The coil spring provides an increased spring-back force for the lead terminal. The lead terminal may be connected to the coil spring by soldering to cut off one another in the event of overcurrent.

However, the aforementioned first connection structure (FIG. 6) includes the spring piece 42 made of a shape-memory alloy which is expensive. The second connection structure (FIG. 7) must be connected to PTC 44 by soldering against a spring-back force of the lead terminal 45, which requires a troublesome connection work thereof The lead terminal having the coil spring also requires a complicated connection work thereof and increases in the part number/cost. These are disadvantage in the prior arts.

SUMMARY OF THE INVENTION

In view of the disadvantages in the prior arts, an object of the present invention is to provide a connection structure of a circuit protection element for reliably cutting off current in a circuit when the circuit is subjected to an abnormal large current. The connection structure can also surely cut off the circuit when the circuit protection element is highly heated due to a failure thereof. Furthermore, the connection structure allows an easy assembling/connection of the circuit protection element to the circuit board. In addition, the connection structure is not expensive.

In order to achieve the object, the present invention provides a connection structure of a circuit protection element for securely connecting at least two lead terminals of the circuit protection element to a circuit board. The connection structure includes terminal connection elongated holes provided in the circuit board for connecting the lead terminals to the circuit board by soldering. The circuit board is positioned in such a way that the elongated direction of the elongated terminal connection hole is positioned in a downward direction.

Preferably, the elongated hole is enough long to have a clearance in the elongated direction when the lead terminal is connected to the circuit board by soldering. Preferably, the soldering material is solder having a melting point enough low to protect the circuit board in the event of overcurrent. The circuit protection element may be a thermister which has a resistance increasing with the temperature increase thereof.

Next, operational effects of the present invention will be discussed.

As discussed above, in the present invention, when an abnormally large current is applied to the circuit, or when the circuit protection element fails to heat itself up to a high temperature, the solder would melt. Thereby, the lead terminals easily disengage from the terminal connection holes so that the circuit protection element falls freely from the circuit board. Thus, the circuit is surely cut off easily.

In addition, the assembling/connection of the circuit protection element to the circuit board can be easily carried out in the same way as conventional ones. Therefore, a significant decrease in manufacturing man hour/cost is achieved as compared with the shape memory property lead terminal and the spring-back terminal which have been described in the prior art.

BRIEF DESCRIPTION OF THE DRAWINGS

FIG. 3A is a general longitudinal sectional view showing another embodiment of a connection structure of a circuit protection element according to the present invention, and FIG. 3B is a sectional view along line B—B of FIG. 3A;

FIG. 6 is a longitudinal sectional view showing a conventional connecting structure of a circuit protection element; and FIG. 7 is a side view showing another conventional example.

DETAILED DESCRIPTION OF THE PREFERRED EMBODIMENTS

Referring to the accompanied drawings, embodiments will be discussed in detail.

Figure 1A:
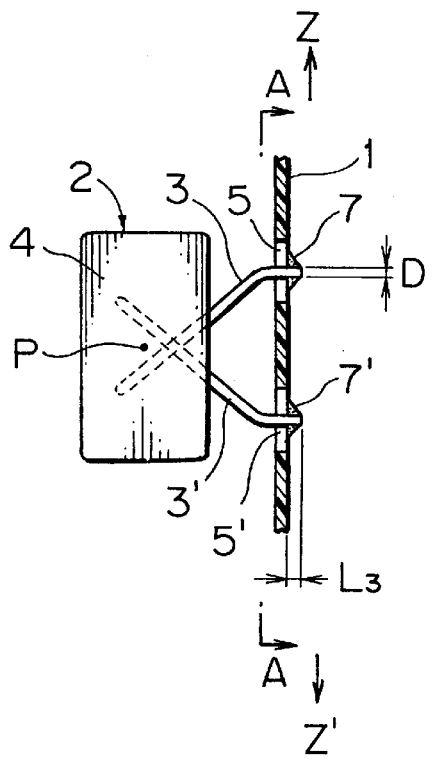
FIG. 1A is a general longitudinal sectional view showing an embodiment of a connection structure of a circuit protection element according to the present invention.
Figure 1B:
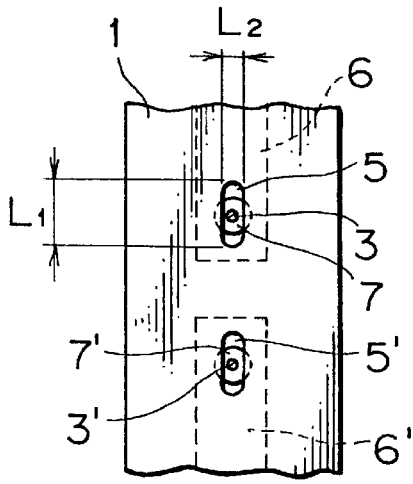
FIG. 1B is a sectional view along line A—A of FIG. 1A.

FIGS. 1A, 1B show an embodiment of a connection structure of a circuit protection element according to the present invention.

In this structure, a circuit board 1 is disposed vertically, and a positive characteristic thermister (PTC) 2 is a circuit protection element having a pair of lead terminals 3, 3'. One lead terminal 3 is positioned higher than the gravity center P of PTC 2. There are provided a pair of terminal connection holes 5, 5' each having an elongated length (i.e. elongated holes) in the circuit board 1. The terminal connection holes 5, 5' each are associated with one of the lead terminals 3, 3'. The elongated directions of the terminal connection holes 5, 5' are characteristically directed in a vertical direction while the circuit board 1 is disposed vertically.

The circuit board 1 includes a plurality of circuit conductors in specific patterns. The lead terminals 3, 3' of PTC 2 each are connected to one of vertically aligned circuit conductors 6, 6' by means of solder 7 or 7'. The lead terminals 3, 3' cross over each other in a plate-shaped PTC body (semiconductor) 4. PTC body 4 has a rectangular or round shape generally.

In FIG. 1A, arrow head Z shows an upward direction, and arrow head Z' shows a downward direction. The circuit board 1 is longitudinally disposed in a vertical plain so that the pair of terminal connection holes 5, 5' are aligned vertically. At the center of each terminal connection hole 5 or 5', there is disposed one of the lead terminals 3, 3'. Then, by means of the solder 7, 7', the lead terminals are connected respectively to the circuit conductor 6 or 6' of the circuit board 1, more specifically to a land portion (not shown) integrally formed in the circuit conductor 6 or 6'. Each solder 7 or 7' is deposited around a middle portion of each terminal connection hole 5 or 5' in the rear surface of the circuit board 1. Preferably, the elongated terminal connection hole is enough long to have a clearance in the elongated direction when the lead terminal is connected to the circuit board by soldering.

The terminal connection holes 5, 5' each have a longitudinal dimension (length) $L_1$ which is at least a few times of the outer diameter D of the lead terminals 3, 3'. The lead terminals 3, 3' must be constructed to be easily disconnected to fall apart from the terminal connection holes 5, 5' when the solder 7, 7' is molten. The terminal connection holes 5, 5' each have a lateral dimension $L_2$ a little larger than the outer diameter D of the lead terminals 3, 3'. Preferably, an extended length $L_3$ of the lead terminals 3, 3' from the rear surface of the circuit board 1 is as short as possible with maintaining a sufficient securing strength provided by the solder 7 or 7', allowing an easy disconnection thereof when the solder 7 or 7' is molten.

Figure 2:
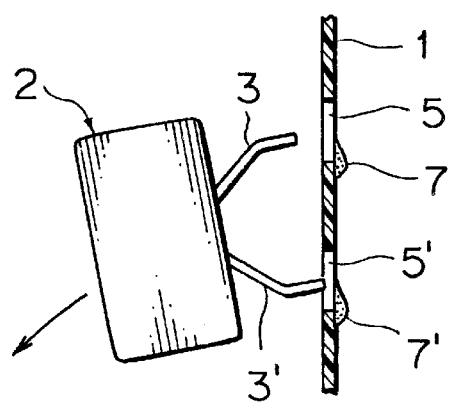
FIG. 2 is a general longitudinal sectional view showing an operational movement of the connection structure of FIG. 1.

FIG. 2 shows an operational movement of the aforementioned embodiment.

When an abnormal current is applied to the circuits 6, 6' (FIG. 1), or when PTC 2 fails to heat itself up to a high temperature, the solder 7, 7', which has secured the lead terminals 3, 3' to the circuit board 1, melts due to a high temperature thereof. With the melting, PTC 2 falls freely from the circuit board 1, so that current between the circuits 6, 6' is interrupted.

As shown in FIG. 1, the terminal connection holes 5, 5' are vertically elongated, and one lead terminal 3 is positioned higher than the gravity center P of PTC 2. This enables that the upper end of the lead terminal 3 turns substantially along an arc when PTC 2 falls as shown in FIG. 2. PTC 2 falls easily surely without being hooked on a periphery of the terminal connection holes 5, 5' to be disconnected from the terminal connection holes 5, 5'. This allows an easy and sure disconnection of the circuits 6, 6' (FIG. 1A).

In addition, PTC 2 itself may be a conventional one without using a special expensive element such as a shape-memory property terminal (FIG. 6) and a spring-back terminal (FIG. 7) which have been described in the prior art. Thus, no part cost increase will be brought about in PTC 2. Furthermore, The connection work or process of PTC 2 is almost the same as that of a conventional PTC, causing no increase in manufacturing man hour/cost.

FIGS. 3A, 3B shows an embodiment which includes a PTC (circuit protection element) 12 similar to the aforementioned one. PTC 12 is positioned in a horizontal plane and is connected to a vertical circuit board 11.

A pair of lead terminals 13, 13' are horizontally opposed to each other and are securely connected to a pair of elongated terminal connection holes 15, 15' by means of solder 17, 17'. A pair of terminal connection holes 15, 15' are also horizontally aligned to each other. In FIG. 3A, arrow head Z shows an upward direction and arrow head Z' shows a downward direction. The relationship between the lead terminals 13, 13' will not be discussed since the dimensions thereof associated with the terminal connection holes 15, 15' are the same as those of the aforementioned lead terminals 3, 3'. In FIG. 3B, denoted 16, 16' are circuit conductors.

Figure 4:
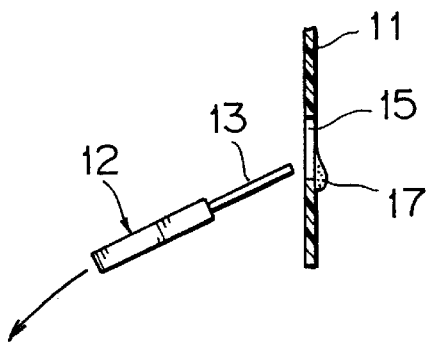
FIG. 4 is a general longitudinal sectional view showing an operational movement of the connection structure of FIG. 3.

FIG. 4 is an illustration showing that PTC 12 of the embodiment shown in FIG. 3 is falling down from the circuit board after an abnormal high temperature has melted the solder 17, 17' (FIG. 3).

Similarly to the first embodiment, the terminal connection holes 15, 15' are vertically elongated so that the pair of left and right lead terminals 13, 13' are not hooked on the terminal connection holes 15, 15'. Thus, the lead terminals 13, 13' are smoothly disconnected from the terminal connection holes 15, 15', causing the falling of PTC 12. Thereby, the circuits 16, 16' (FIG. 3) are surely disconnected, giving the same operational effects as the first embodiment.

Figure 5:
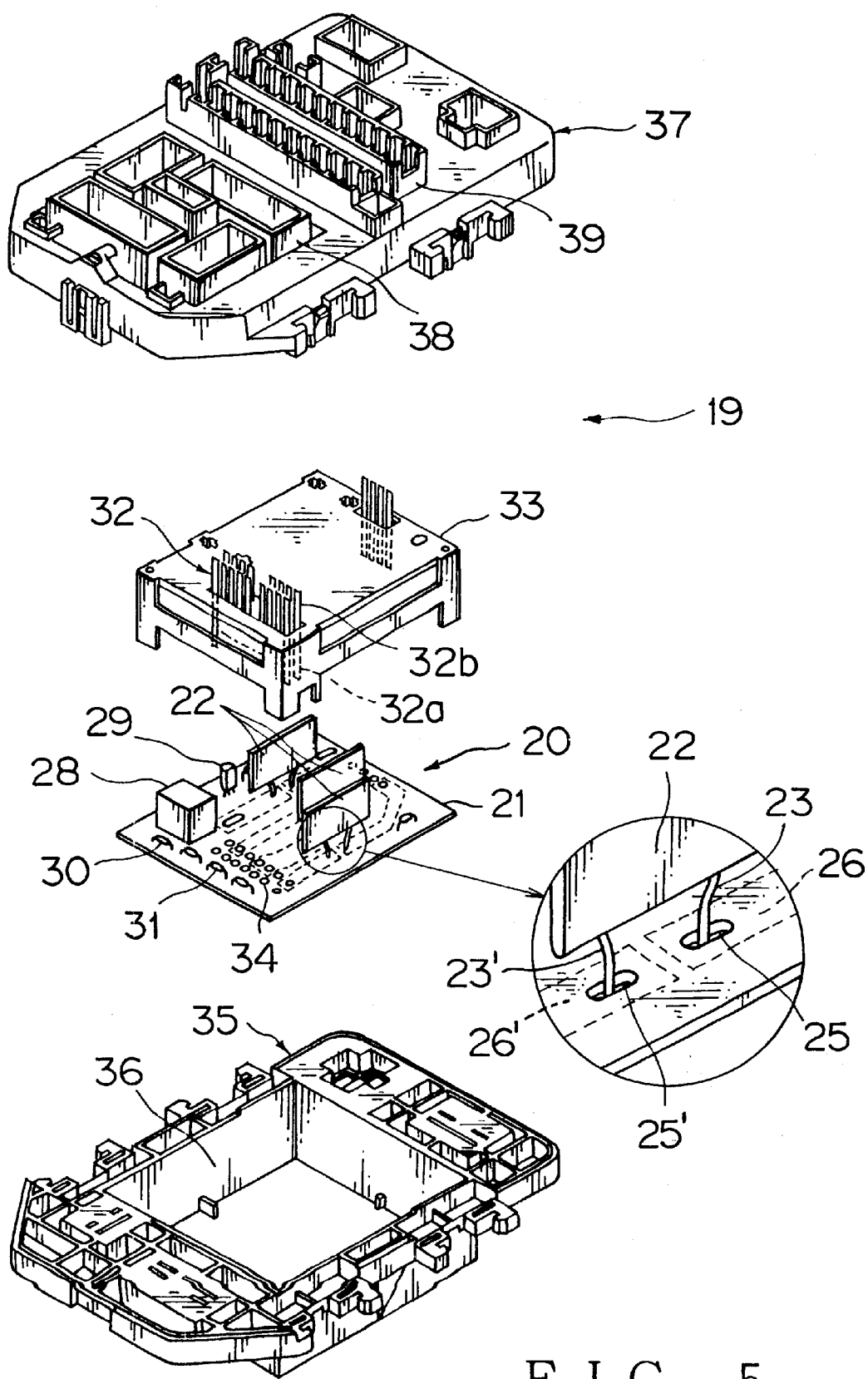
FIG. 5 is an exploded perspective view showing a junction box provided with a connection structure of a circuit protection element according to the present invention.

FIG. 5 shows a junction box 19 as an application example of a circuit board assembly 20 including PTC (circuit protection element) 22.

PTC 22 has a pair of lead terminals 23, 23' which are securely connected to a pair of terminal connection elongated holes 25, 25' formed in a circuit board 21 by means of solder (not shown). Terminal connection holes 25, 25' each are connected to each of circuit conductors 26, 26'. In addition to a plurality of PTCs 22, the circuit board 21 is mounted with electronic elements such as a relay 28, a transistor 29, a resistance 30, and a diode 31 which are connected to the circuit, composing a power circuit board assembly 20.

The circuit board assembly 20 is overlaid by a terminal holding base 33 having a plurality of male terminals 32. Pins 32a each formed at one 26 end of each male terminal 32 are inserted into connection holes 34 of the circuit board 21 to be connected thereto. The circuit board assembly 20 and the terminal holding base 33 are received in a receiving space 36 of a case 35. The case 35 is overlaid by a cover 37. Tabs 32b each formed at the other end of each male terminal 32 are received in a connector housing 38 of the cover 37. The cover 37 accommodates busbars (not shown) to compose a fuse connection portion 39 or the like. The junction box 19 is assembled in an automobile body (not shown) in such a way that each elongated direction of the terminal connection holes 25, 25' of the circuit board 21 is directed vertically.

When the circuit 26, 26' and PTC 22 of the circuit board 21 heat themselves abnormally, solder deposits (not shown) of the lead terminals 23, 23' melt so that the lead terminals 23, 23' part easily from the terminal connection holes 25, 25'. Thus, PTC 22 falls out from the circuit board 21 to be received within the terminal holding base 33. The fallout of PTC 22 surely cuts electrical connection between the circuits 26, 26' to protect other electronic parts 28 to 31 of the circuit board assembly 20 and electrical elements in the junction box 19.

The circuit boards 1, 11 and 21 described in the aforementioned embodiments may not be correctly positioned vertically (in an angle of 90°). That is, the circuit boards 1, 11 and 21 may be positioned in an angle more or less than 90° to the horizontal as far as each elongated direction of the terminal connection elongated holes 5, 5', 15, 15', 25 and 25' is directed vertically. PTCs 2, 12 and 22 in an upside-down condition may be effectively connected to the circuit boards 1, 11 and 21.

What is claimed is:

1. A connection structure of a circuit protection element for securely connecting at least two lead terminals of said circuit protection element to a circuit board, said connection structure comprising terminal connection elongated holes provided in said circuit board each for connecting one of said lead terminals to said circuit board by soldering, wherein said circuit board is positioned in such a way that the elongated direction of each terminal connection elongated hole is directed downward.

2. The connection structure set forth in claim 1, wherein said elongated hole is enough long to have a clearance in the elongated direction when said lead terminal is connected to said circuit board by soldering.

3. The connection structure set forth in claim 1, wherein a solder material used in the soldering has a melting point enough low to protect said circuit board in the event of overcurrent.

4. The connection structure set forth in claim 1, wherein said circuit protection element is a thermister which has a resistance increasing with the temperature increase thereof.

* * * * *

UNITED STATES PATENT AND TRADEMARK OFFICE
CERTIFICATE OF CORRECTION

PATENT NO.: 6,088,234
DATED : July 11, 2000
INVENTOR(S): ISHIKAWA et al.

It is certified that an error appears in the above-identified patent and that said Letters Patent is hereby corrected as shown below:

On the title page of the patent in item [30], the Foreign Application Priority Data, change "May, 6 1998 [JP] Japan ............ 10-157614" to be --June 5, 1998 [JP] Japan ............ 10-157614--

Signed and Sealed this

Seventeenth Day of April, 2001

Attest:

NICHOLAS P. GODICI

Attesting Officer

Acting Director of the United States Patent and Trademark Office